(12) United States Patent
Maruko et al.

(10) Patent No.: US 10,281,337 B2
(45) Date of Patent: May 7, 2019

(54) THERMOCOUPLE AND MANUFACTURING METHOD FOR SAME

(71) Applicant: FURUYA METAL CO., LTD., Toshima-ku, Tokyo (JP)

(72) Inventors: Tomohiro Maruko, Tokyo (JP); Tomoaki Miyazawa, Tokyo (JP); Atsushi Ito, Tokyo (JP); Shoji Saito, Tokyo (JP); Yasuhiro Sato, Tokyo (JP)

(73) Assignee: FURUYA METAL CO., LTD., Toshima-ku, Tokyo (JP)

( * ) Notice: Subject to any disclaimer, the term of this patent is extended or adjusted under 35 U.S.C. 154(b) by 338 days.

(21) Appl. No.: 15/022,479

(22) PCT Filed: Sep. 19, 2014

(86) PCT No.: PCT/JP2014/074826
§ 371 (c)(1),
(2) Date: Mar. 16, 2016

(87) PCT Pub. No.: WO2015/041315
PCT Pub. Date: Mar. 26, 2015

(65) Prior Publication Data
US 2016/0231181 A1 Aug. 11, 2016

(30) Foreign Application Priority Data

Sep. 20, 2013 (JP) .................. 2013-195871

(51) Int. Cl.
| | |
|---|---|
| *G01K 7/00* | (2006.01) |
| *G01K 1/08* | (2006.01) |
| *H01L 35/02* | (2006.01) |
| *G01K 1/12* | (2006.01) |

(Continued)

(52) U.S. Cl.
CPC ................. *G01K 1/08* (2013.01); *G01K 1/12* (2013.01); *G01K 7/02* (2013.01); *G01K 7/04* (2013.01); *H01L 35/02* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,960,604 | A | * | 6/1976 | Heitzinger ............... G01K 1/08 136/233 |
| 5,520,461 | A | * | 5/1996 | Curry ....................... G01K 1/10 136/232 |

(Continued)

FOREIGN PATENT DOCUMENTS

| | | |
|---|---|---|
| JP | 62-274071 | 11/1987 |
| JP | 01-272932 | 10/1989 |

(Continued)

OTHER PUBLICATIONS

International Preliminary Report on Patentability dated Mar. 31, 2016 from corresponding International Application PCT/JP2014/074826, 9 pages.

(Continued)

*Primary Examiner* — Harshad R Patel
*Assistant Examiner* — Nasir U. Ahmed
(74) *Attorney, Agent, or Firm* — Ohlandt, Greeley, Ruggiero & Perle, L.L.P.

(57) ABSTRACT

A thermocouple that can stably perform direct temperature measurement under a high temperature environment (1500° C. or higher but 2300° C. or lower) and a manufacturing method for the same. A thermocouple according to a first embodiment is a thermocouple including at least a protective tube and element wires, the protective tube and the element wires are insulated from one another by an insulator, and the insulator is either one or both of a powder and a compact, and is composed of at least one of a zirconium oxide, a hafnium oxide, or a composite oxide of zirconium and hafnium.

11 Claims, 8 Drawing Sheets (51) Int. Cl.
*G01K 7/04* (2006.01)
*G01K 7/02* (2006.01)

(56) References Cited

U.S. PATENT DOCUMENTS

| | | | |
|---|---|---|---|
| 5,712,886 A | 1/1998 | Baldy | |
| 7,855,632 B1* | 12/2010 | Schuh | G01K 1/08 338/28 |
| 2010/0020848 A1* | 1/2010 | Nazmy | C22C 19/057 374/179 |
| 2013/0223479 A1* | 8/2013 | Satou | G01K 1/12 374/163 |

FOREIGN PATENT DOCUMENTS

| | | |
|---|---|---|
| JP | 05-167103 | 7/1993 |
| JP | 06-229837 | 8/1994 |
| JP | 08-271349 | 10/1996 |
| JP | 08-339845 | 12/1996 |
| JP | 09-138293 | 5/1997 |
| JP | 10-019688 | 1/1998 |
| JP | 2002-350240 | 12/2002 |
| JP | 2003-004538 | 1/2003 |
| JP | 2010-060445 | 3/2010 |
| JP | 2012-132071 | 7/2012 |

OTHER PUBLICATIONS

Japanese Office Action dated Sep. 18, 2018 from corresponding Japanese Patent Application No. JP 2015-537974, 9 pages.
International Search Report dated Dec. 22, 2014 corresponding to International Patent Application No. PCT/JP2014/074826; 2 pages.

* cited by examiner

Fig. 9 though it is not a thermocouple technology, as a method for suppressing volatilization loss of platinum-group noble metals constituting a high-temperature apparatus, there is disclosed a method for forming a coating layer having a thickness of 50 to 500 μm and made of stabilized zirconia on an outer surface of the high-temperature apparatus by spraying (for example, see Patent Literature 3).

A manufacturing method for a sheathed thermocouple is disclosed (for example, see Patent Literature 4).

THERMOCOUPLE AND MANUFACTURING METHOD FOR SAME

BACKGROUND

1. Field of the Disclosure

The present disclosure relates to a thermocouple and a manufacturing method for same.

2. Discussion of the Background Art

In recent years, with regard to power semiconductors, glasses, and oxide single crystals of other laser elements, piezo elements, scintillator elements, or the like, performance improvement is required and a manufacturing temperature tends to increase. In addition, even with regard to an engine combustion temperature in a field of aerospace, performance improvement is required and a manufacturing temperature tends to increase. In a high temperature field of 1500° C. or higher, a radiation thermometer can be used for temperature measurement in general. In the temperature measurement using the radiation thermometer, energy of infrared light and visible light is measured in response to a temperature of an object and is converted into a temperature. For this reason, in the radiation thermometer, a temperature of a surrounding environment (particularly, in a case where water vapor, dust, gas, or the like is present) or a space itself cannot be measured in principle. Accordingly, there was a problem that the temperature could not be precisely measured.

A thermocouple is a stable temperature sensor with high accuracy using a Seebeck effect. However, the thermocouple cannot be stably used under a severe environment such as an oxidation atmosphere or a carbon-reducing atmosphere in the high temperature field of 1500° C. or higher and relies on calculation values by combustion gas analysis or a temperature simulation obtained from a heating output.

The cause that the thermocouple cannot be stably used under the oxidation atmosphere or the carbon-reducing atmosphere is associated with element wires and a protective tube, and an insulator provided therebetween. A thermocouple to be used at a high temperature is, for example, a thermocouple having element wires which are formed using Pt and Rh, a thermocouple having element wires which are formed using Ir and Rh, or a thermocouple having element wires which are formed using W and Re. The thermocouple having the element wires formed using Pt and Rh is vulnerable to the carbon-reducing atmosphere. The thermocouple having the element wires formed using W or Re cannot be used, resulting from oxidation damage in the oxidation atmosphere. In addition, the thermocouple having the element wires formed using Ir and Rh has durability in both environments compared to other thermocouples, but the durability is not satisfactory. Thus, a protective tube is used. For example, there is disclosed a thermocouple in which metal element wires constituting a temperature measurement junction in such a manner that ends at one side thereof are joined to each other and being made up of one pair out of a pair of Pt—Rh alloy wire and Pt—Rh alloy wire, a pair of Pt wire and Pt—Rh alloy wire, and a pair of Ir wire and Ir—Rh alloy wire are inserted into an insulating tube, the insulating tube is inserted into a protective tube, and a filler is filled in a gap between the protective tube and the element wires (for example, see Patent Literature 1). In addition, there is disclosed a thermocouple in which element wires coated with colloidal silica is inserted into a protective tube made of alumina or a protective tube made of quartz (for example, see Patent Literature 2).

PRIOR ART DOCUMENTS

Patent Literature

Patent Literature 1: JP 2002-350240 A
Patent Literature 2: JP 10-19688 A
Patent Literature 3: JP 2012-132071 A
Patent Literature 4: JP 2010-060445 A The use of alumina as the insulating tube is disclosed in Patent Literature 1, and the use of alumina as the protective tube is disclosed in Patent Literature 2. However, since strength of the alumina deteriorates at 1900° C. or higher, these thermocouples cannot be used at 1900° C. or higher. Furthermore, the coating of the colloidal silica on the element wires and the use of quartz as the protective tube are disclosed in Patent Literature 2. However, a silicon oxide softens at 1700° C. or higher and is volatilized by being partially pyrolyzed at a higher temperature. When the pyrolyzed and volatilized component adheres to the element wires, there is a problem that the element wires are reduced in melting point, resulting in being broken by melting or embrittlement.

Furthermore, as an insulator used for the thermocouple to be used at a high temperature, for example, a thorium oxide or a beryllium oxide is used in addition to the aluminum oxide. However, since the thorium oxide is a radioactive substance and the beryllium oxide has toxicity, the use is limited.

An object of the present disclosure is to provide a thermocouple that can stably perform direct temperature measurement under a high temperature environment (1500° C. or higher but 2300° C. or lower) and a manufacturing method for the same.

SUMMARY

A thermocouple according to the present disclosure includes at least a protective tube and element wires, wherein the protective tube and the element wires are insulated from one another by an insulator, and the insulator is either one or both of a powder and a compact, and is composed of at least one of a zirconium oxide, a hafnium oxide, or a composite oxide of zirconium and hafnium.

In the thermocouple according to the present disclosure, it is preferable that the insulator is configured such that the content of each element of Al, Fe, Si, and Ti is 100 ppm or less by mass and the content of C is 10 ppm or less by mass. When the thermocouple is used at a high temperature of 1900° C. or higher, durability can be further improved.

In the thermocouple according to the present disclosure, it is preferable that a surface of the element wires is covered with an oxygen barrier film, and a thickness of the oxygen barrier film is 20 nm or more but 800 nm or less. It is possible to suppress oxidation volatilization or oxidation degradation of the element wires. Furthermore, it is possible to prevent reduction in melting point of the element wires caused by adhesion of impurities decomposed and volatilized from the insulator.

In the thermocouple according to the present disclosure, it is preferable that the element wires are formed using one or two elements selected from Ir, Pt, Rh, Mo, Re, Nb, Ta, and W. Depending on a temperature to be measured, a material can be selected.

In the thermocouple according to the present disclosure, it is preferable that the oxygen barrier film to cover the surface of the element wires contains an oxide as a main component, and an element for bonding with oxygen in the oxide is either one or both of Hf and Zr. It is possible to prevent reduction in melting point of the oxide.

In the thermocouple according to the present disclosure, it is preferable that at least one of all or part of an outer surface of the protective tube and all or part of an inner surface of the protective tube is covered with the oxygen barrier film, and a thickness of the oxygen barrier film is 20 nm or more but 800 nm or less. It is possible to suppress oxidation volatilization or oxidation degradation of the protective tube. In addition, it is possible to prevent reduction in melting point of the protective tube caused by adhesion of impurities decomposed and volatilized from the insulator.

In the thermocouple according to the present disclosure, it is preferable that the protective tube is formed using one or two elements selected from Ir, Pt, Rh, Ru, Mo, Re, Nb, Ta, or W. Depending on a temperature to be measured, a material can be selected.

In the thermocouple according to the present disclosure, it is preferable that the oxygen barrier film to cover an outer surface or an inner surface of the protective tube contains an oxide as a main component, and an element for bonding with oxygen in the oxide is either one or both of Hf or Zr. It is possible to prevent reduction in melting point of the oxide.

In a manufacturing method of the thermocouple according to the present disclosure, after the element wires and the insulator are inserted into the protective tube, wire drawing is not performed.

The present disclosure can provide a thermocouple that can stably perform direct temperature measurement under a high temperature environment (1500° C. or higher but 2300° C. or lower) and a manufacturing method for the same.

BRIEF DESCRIPTION OF THE DRAWINGS

FIG. 1(a) is an example of a partially enlarged cross-sectional view of an element wire, and FIG. 1(b) is an example of a partially enlarged cross-sectional view of a protective tube.

DETAILED DESCRIPTION OF THE PREFERRED EMBODIMENT

The present disclosure will be described in detail using embodiments but is not limited to the descriptions of the embodiments. In addition, the embodiments may be variously modified as long as effects of the present disclosure can be obtained.

Figure 1:
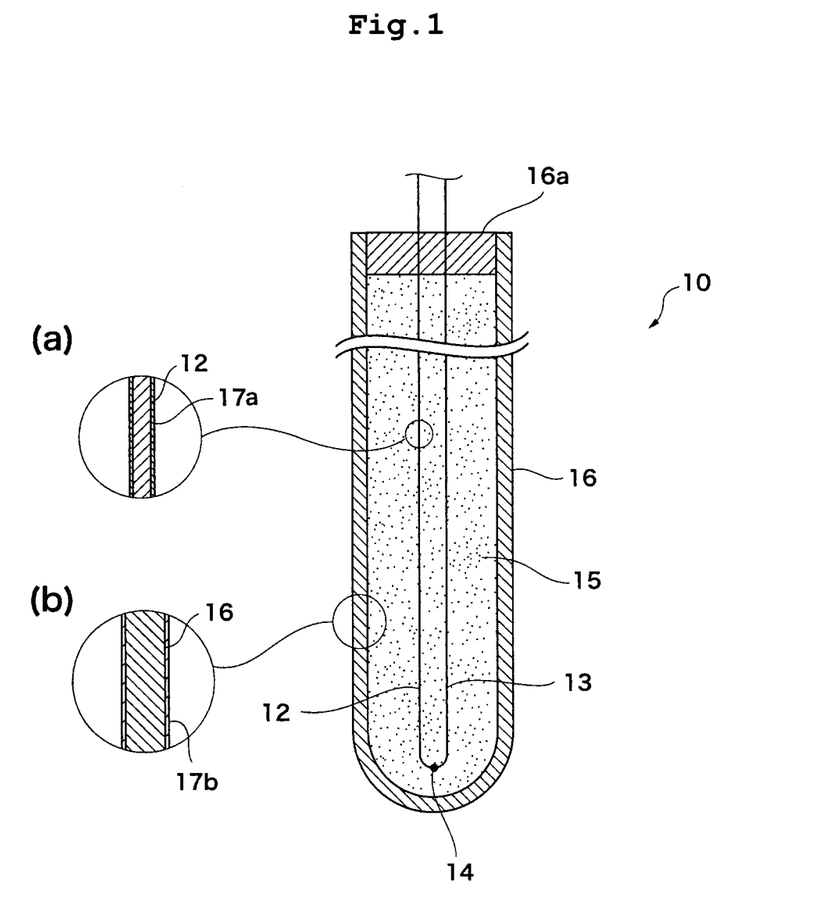
FIG. 1 is a cross-sectional side views illustrating enlarged parts of a thermocouple according to a first embodiment, respectively.

FIGS. 1(a) and 1(b) are a cross-sectional side views illustrating an enlarged part of a thermocouple according to a first embodiment, respectively, FIG. 1(a) is an example of a partially enlarged cross-sectional view of an element wire, and FIG. 1(b) is an example of a partially enlarged cross-sectional view of a protective tube. A thermocouple 10 according to the first embodiment is a thermocouple including at least a protective tube 16 and element wires 12 and 13, wherein the protective tube 16 and the element wires 12 and 13 are insulated from one another by an insulator 15, and the insulator 15 is a powder, which is composed of at least one of a zirconium oxide, a hafnium oxide, or a composite oxide of zirconium and hafnium.

The element wires 12 and 13 are preferably composed of one or two kinds elements selected from Ir, Pt, Rh, Mo, Re, Nb, Ta, and W. Depending on a temperature to be measured, a material can be selected. A dispersion strengthened alloy as well as a pure metal may be formed using one element selected from Ir, Pt, Rh, Mo, Re, Nb, Ta, and W. The dispersion strengthened alloy is, for example, an oxide dispersion strengthened (ODS) alloy (for example, ODS platinum). A preferable specific example of an alloy consisting of two or more elements selected from Ir, Pt, Rh, Mo, Re, Nb, Ta, and W may include Pt—Rh, Ir—Rh, Mo—Re, Mo—Nb, Mo—Ta, W—Re, W—Mo, or Nb—Ta. In addition, a dispersion strengthened alloy may be included which is obtained by dispersing an oxide or the like into each alloy.

The element wires 12 and 13 are formed by, for example, a combination of Pt—Rh and Pt—Rh which have different components, respectively, a combination of Pt—Rh and Pt, a combination of Pt—Ir and Pt, a combination of Rh and Pt, a combination of Rh and Pt—Rh, a combination of Pt—Mo and Pt, a combination of Ir—Rh and Ir, a combination of Ir—Rh and Ir—Rh which are different components, respectively, a combination of Ir and Pt—Rh, a combination of W—Re and W—Re which are different components, respectively, a combination of W and W—Re, a combination of Mo and Re, a combination of Mo and Nb, a combination of Mo and Ir, a combination of Mo and W, a combination of W and Ir, or a combination of W and Ta. These combinations are merely exemplary, and a combination of the element wires 12 and 13 is not particularly limited in the present disclosure.

The surface of the element wires 12 and 13 is preferably covered with an oxygen barrier film 17a, as illustrated in FIG. 1(a). In addition, the thickness of the oxygen barrier film 17a is preferably 20 nm or more but 800 nm or less. The thickness of the oxygen barrier film 17a is preferably 40 nm or more but 600 nm or less, and particularly preferably 50 nm or more but 80 nm or less. When the thickness of the oxygen barrier film 17a is less than 20 nm, oxidation volatilization or oxidation degradation of the element wires 12 and 13 may not be suppressed and reduction in melting point of the element wires 12 and 13 due to adhesion of impurities decomposed and volatilized from the insulator 15 may not be suppressed. When the thickness of the oxygen barrier film 17a exceeds 800 nm, the oxygen barrier film 17a may be detached from the element wires 12 and 13 or may crack due to difference in coefficient of thermal expansion with the materials of the element wires 12 and 13. As a result, oxidation volatilization or oxidation degradation of the element wires 12 and 13 may not be suppressed and reduction in melting point of the element wires 12 and 13 due to adhesion of impurities decomposed and volatilized from the insulator 15 may not be suppressed. The oxygen barrier film 17a may cover all or part of the surface of the element wires 12 and 13. The oxygen barrier film covers a part of the element wires 12 and 13 in a form of covering only a portion in which oxidation degradation or oxidation volatilization may occur.

It is preferable that the oxygen barrier film 17a to cover the surface of the element wires 12 and 13 contains an oxide as a main component, and an element for bonding with oxygen in the oxide is either one or both of Hf and Zr. The oxygen barrier film 17a for covering the surface of the element wires 12 and 13 has more preferably the same material as that of the insulator 15. The reduction in melting point of the oxide can be prevented. In a case where the element for bonding with oxygen in the oxide is either of Hf or Zr, the oxygen barrier film 17a is a film containing a hafnium oxide or a film containing a zirconium oxide. In a case where the element for bonding with the oxygen in the oxide is both of Hf and Zr, the oxygen barrier film 17a is a film containing a hafnium oxide and a zirconium oxide or a film containing a composite oxide containing zirconium and hafnium. In the present disclosure, the ratio of hafnium and zirconium is not particularly limited.

In the thermocouple 10 according to the present embodiment, end portions of the element wires 12 and 13 on a side opposite to a temperature measurement junction 14 may be connected to compensation lead wires (not illustrated), respectively. Out of end portions of the compensation lead wires (not illustrated), end portions on a side opposite to connection portions (compensation contacts) between the element wires 12 and 13 are connected to terminals (not illustrated) of a thermoelectromotive force-measuring device. Then, the temperature measurement junction 14 is electrically conducted to the terminals (not illustrated) through the compensation lead wires (not illustrated). A material of the compensation lead wire (not illustrated) is not particularly limited. In addition, the surface of the compensation lead wire may be covered with an insulating layer (not illustrated) containing, for example, glass fiber, polytetrafluoroethylene, vinyl chloride, or silicone.

The protective tube 16 is preferably formed using one or two elements selected from Ir, Pt, Rh, Ru, Mo, Re, Nb, Ta, or W. Depending on an atmosphere in which a temperature to be measured, a material can be selected. A dispersion strengthened alloy as well as a pure metal may be formed using one element selected from Ir, Pt, Rh, Ru, Mo, Re, Nb, Ta, or W. The dispersion strengthened alloy is, for example, an oxide dispersion strengthened (ODS) alloy (for example, ODS platinum). A specific example of an alloy consisting of two or more elements selected from Ir, Pt, Rh, Ru, Mo, Re, Nb, Ta, or W may include Pt—Rh, Pt—Ir, Ir—Rh, Ir—Ru, Ir—Re, Ir—W, Mo—Re, Mo—Nb, Mo—Ta, Mo—W, Nb—Ta, Nb—W, or Ta—W. In addition, a dispersion strengthened alloy may be included which is obtained by dispersing an oxide or the like into each alloy.

The protective tube 16 is a hollow member which is opened at one end, and the one opened end is sealed with a sealing portion 16a after the element wires 12 and 13 and the insulator 15 are accommodated in the protective tube 16. Alternatively, the one opened end may be sealed with the sealing portion 16a after the element wires 12 and 13 and the insulator 15 are accommodated in the protective tube 16, followed by being gas displacement or depressurization. The thickness of the protective tube 16 is preferably 0.1 to 5.0 mm, and more preferably 0.5 to 2.0 mm. As the thickness of the protective tube becomes thinner, heat can be easily transferred and responsiveness can be improved. In the present disclosure, the shape of the protective tube 16 is not particularly limited.

At least one of all or part of an outer surface of the protective tube 16, and all or part of an inner surface of the protective tube 16 is preferably covered with an oxygen barrier film 17b as illustrated in FIG. 1(b). In addition, the thickness of the oxygen barrier film 17b is preferably 20 nm or more but 800 nm or less. The thickness of the oxygen barrier film 17b is preferably 40 nm or more but 600 nm or less, and particularly preferably 50 nm or more but 80 nm or less. When the thickness of the oxygen barrier film 17b is less than 20 nm, oxidation volatilization or oxidation degradation of the protective tube 16 may not be suppressed and reduction in melting point of the protective tube 16 due to adhesion of impurities decomposed and volatilized from the insulator 15 may not be suppressed. When the thickness of the oxygen barrier film 17b exceeds 800 nm, the oxygen barrier film 17b may be detached from the protective tube 16 or may crack due to difference in coefficient of thermal expansion with the material of the protective tube 16. As a result, oxidation volatilization or oxidation degradation of the protective tube 16, and reduction in melting point of the protective tube 16 due to adhesion of impurities decomposed and volatilized from the insulator 15 may not be suppressed.

A form of covering the protective tube 16 with the oxygen barrier film 17b includes, for example, a form of covering all of the outer surface of the protective tube 16, a form of covering the part of the outer surface of the protective tube 16, a form of covering all of the inner surface of the protective tube 16, a form of covering the part of the inner surface of the protective tube 16, a form of covering all of the outer surface and all of the inner surface of the protective tube 16, a form of covering all of the outer surface and the part of the inner surface of the protective tube 16, a form of covering the part of the outer surface and all of the inner surface of the protective tube 16, or a form of covering the part of the outer surface and the part of the inner surface of the protective tube 16. The oxygen barrier film covers a part of the outer surface and/or the inner surface of the protective tube 16 in a form of covering only a portion in which oxidation degradation or oxidation volatilization may occur, for example.

It is preferable that the oxygen barrier film 17b to cover the outer surface or the inner surface of the protective tube 16 contains an oxide as a main component, and an element for bonding with oxygen in the oxide is either one or both of Hf or Zr. The oxygen barrier film 17b for covering the surface of the protective tube 16 has more preferably the same material as that of the insulator 15. The reduction in melting point of the oxide can be prevented. In a case where the element for bonding with oxygen in the oxide is either of Hf or Zr, the oxygen barrier film 17b is a film containing a hafnium oxide or a film containing a zirconium oxide. In a case where the element for bonding with the oxygen in the oxide is both of Hf and Zr, the oxygen barrier film 17b is a film containing a hafnium oxide and a zirconium oxide or a film containing a composite oxide containing zirconium and hafnium. In the present disclosure, the ratio of hafnium and zirconium is not particularly limited.

The protective tube 16, and the element wires 12 and 13 are insulated from one another by the insulator 15. In this description, the meaning of "being insulated" is that a resistance value is 10 Ω·cm or more at 2000° C. in an Ar atmosphere, for example.

The insulator 15 is any one of a zirconium oxide powder, a hafnium oxide powder, and a mixed powder of the zirconium oxide powder and the hafnium oxide powder, and is filled between the protective tube 16 and the element wires 12 and 13. A mixing ratio of the mixed powder of the zirconium oxide powder and the hafnium oxide powder is not particularly limited. In the present disclosure, the shape and the average particle size of the powder are not particularly limited.

In the present embodiment, the zirconium oxide includes a form of stabilized zirconia. In addition, the hafnium oxide includes a form of stabilized hafnia. However, the stabilized zirconia or the stabilized hafnia, which can be suitably used, is limited to a particular type represented below. The hafnium oxide has a melting point of 2758° C., but is phase-transformed at 1700° C. In addition, the zirconium oxide has a melting point of 2715° C., but is phase-transformed at 1170° C. With respect to both of them, when the phase transformation occurs, the volume change of 4 to 5% undergoes. For this reason, when a compact is formed of the hafnium oxide or the zirconium oxide, there is a concern that the compact is damaged by the phase transformation. Therefore, in general, an oxide such as an aluminum oxide, a titanium oxide, or a silicon oxide has been added to suppress the phase transformation and improve moldability at the same time. However, there is a concern that such an oxide is partially pyrolyzed at a high temperature exceeding 1900° C. and is thus attached to the element wires or the protective tube, resulting in reducing the melting point. For this reason, in the present embodiment, when the stabilized zirconia is used as the zirconium oxide, it is preferable that alumina-stabilized-zirconia, titania-stabilized-zirconia, and silica-stabilized-zirconia are not used. The stabilized zirconia, which can be suitably used in the present embodiment, is yttria-stabilized-zirconia, calcia-stabilized-zirconia, or magnesia-stabilized-zirconia, for example. In addition, when the stabilized hafnia is used as the hafnium oxide, it is preferable that alumina-stabilized-hafnia, titania-stabilized-hafnia, and silica-stabilized-hafnia are not used. The stabilized hafnia, which can be suitably used in the present embodiment, is yttria-stabilized hafnia, calcia-stabilized-hafnia, or magnesia-stabilized-hafnia, for example. Furthermore, as long as the effect of the disclosure is not impaired, other insulator powders may be filled in addition to the zirconium oxide and/or the hafnium oxide. Other insulators are, for example, an yttrium oxide, a calcium oxide, a magnesium oxide, a thorium oxide, or a beryllium oxide. In the thermocouple according to the first embodiment, since the insulator 15 is the powder, even when being formed of the zirconium oxide or the hafnium oxide not containing a stabilizing agent, there is no concern that the insulator 15 is damaged by the volume change due to the phase transformation of the zirconium oxide or the hafnium oxide.

The insulator 15 is preferably configured such that the content of each element of Al, Fe, Si, and Ti is 100 ppm or less by mass and the content of C is 10 ppm or less by mass. The content of each element of Al, Fe, Si, and Ti is more preferably 80 ppm or less by mass, and particularly preferably 40 ppm or less by mass. In the present embodiment, the content of each element of Al, Fe, Si, Ti, and C is within a predetermined range, and thus it is possible to prevent the damage due to the reduction in melting point of the element wires 12 and 13 and the protective tube 16. The insulator 15 is configured such that the total content of Al, Fe, Si, Ti, and C is preferably 200 ppm or less by mass, and more preferably 140 ppm or less by mass.

Figure 2:
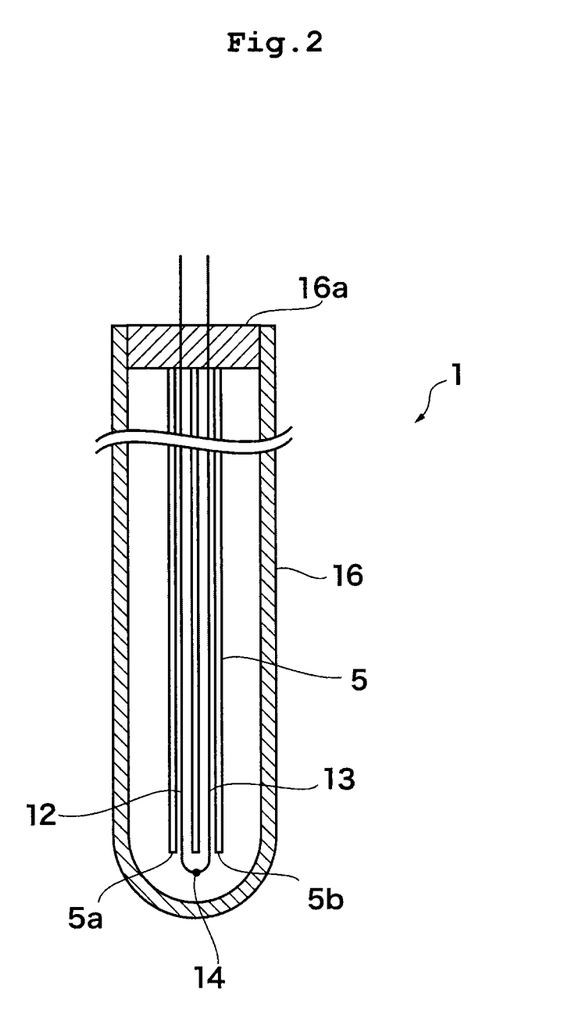
FIG. 2 is a cross-sectional side view illustrating an enlarged part of a thermocouple according to a second embodiment.

FIG. 2 is a cross-sectional side view illustrating an enlarged part of a thermocouple according to a second embodiment. A basic configuration of thermocouple 1 according to the second embodiment is similar to that of the thermocouple 10 according to the first embodiment except that an insulator 5 is a compact. Here, the common configuration will not be presented, and a different configuration will be described.

When the insulator 5 is the compact, the compact is a hollow member which is opened at both ends, for example. In FIG. 2, the insulator 5 is illustrated in which two elongated holes 5a and 5b are formed in one tube and element wires 12 and 13 pass through the elongated holes 5a and 5b, respectively, but may be a hollow member in which an insulating tube for the element wire 12 and an insulating tube for the element wire 13 are provided, respectively, and one elongated hole is provided in one tube. In addition, a temperature measurement junction 14 may come in contact with an inner wall surface of the protective tube 16 or may do not come in contact with the inner wall surface thereof. In FIG. 2, a compensation contact (not illustrated) is disposed outside the protective tube 16, but the compensation contact (not illustrated) may be disposed inside of the protective tube 16.

When the insulator 5 is the compact and is formed of a zirconium oxide or a hafnium oxide not containing a stabilizing agent, the compact is not densely formed, and thus the insulator 5 can be prevented from being damaged by the volume change due to the phase transformation of the zirconium oxide or the hafnium oxide. When the compact is not densely formed, since gaps such as vacancies occur between constituent particles of the compact and the gaps absorb strain caused by the volume change, it is possible to prevent the damage. Examples of methods of not densely forming the compact include: a method of blending a large amount of binder with a raw-material powder, forming a calcined body while mostly keeping escape holes of a binder-derived gas generated at the time of calcination, and then sintering the calcined body; a method of making a pressing pressure necessary for calcination of the raw-material powder minimum at the time of molding the compact, thereby being capable of maintain the shape until the calcinations; and a method of mixing a foaming agent with the binder. A relative bulk density of the compact (compact after sintering) as the insulator 5 is preferably 95% or less, and more preferably 90% or less. The relative bulk density is a ratio (percentage) of a bulk density to a theoretical density.

Both of a powder and a compact may be disposed as an insulator (third embodiment). A basic configuration of a thermocouple according to the third embodiment (not illustrated) is the same as that of thermocouple 10 according to the first embodiment and that of the thermocouple 1 according to the second embodiment except that the insulator is both of the powder and the compact.

A manufacturing method of the thermocouples 1 and 10 according to the present embodiments will be described below.

The element wires 12 and 13 and the protective tube 16 are prepared. The oxygen barrier films 17a and 17b are formed on the surface of the element wires 12 and 13 and the protective tube 16 as necessary. A forming method of the oxygen barrier films 17a and 17b is not particularly limited, and includes a spraying method, a Chemical Vapor Deposition (CVD) method, a Physical Vapor Deposition (PVD) method, a coating pyrolysis method, a spray pyrolysis method, or an atomized pyrolysis method, for example.

The manufacturing method of the thermocouple 10 according to the first embodiment includes: for example, a process of forming the temperature measurement junction 14 by welding the end portions at one side of the element wires 12 and 13 to each other; a process of inserting the element wires 12 and 13 into the protective tube 16; a process of filling the insulator 15 between the protective tube 16 and the element wires 12 and 13; and a process of sealing the protective tube 16 with the sealing portion 16a. In addition, before the process of sealing the protective tube 16, a process of performing gas displacement or depressurization in the inside of the protective tube 16 may be included. The present disclosure is not limited to these procedures.

The manufacturing method of the thermocouple 1 according to the second embodiment includes: for example, a process of passing the element wires 12 and 13 through the elongated holes 5a and 5b of the insulator 5; a process of forming the temperature measurement junction 14 by welding the end portions at one side of the element wires 12 and 13 to each other; a process of inserting the element wires 12 and 13 and the insulator 5 into the protective tube 16; and a process of sealing the insulator 5 and the protective tube 16 with the sealing portion 16a. In addition, before the process of sealing the protective tube 16, a process of performing gas displacement or depressurization in the inside of the protective tube 16 may be included. The present disclosure is not limited to these procedures.

In the manufacturing method of the thermocouples 1 and 10 according to the present embodiments, after the element wires 12 and 13 and the insulators 5 and 15 are inserted into the protective tube 16, wire drawing is not performed. A so-called a sheathed thermocouple is generally manufactured in such a manner that the element wires and the insulator are subjected to wire drawing (diameter reduction) up to a predetermined outer diameter in a state of being inserted into a metal tube as disclosed in the paragraph [0022] of Patent Literature 4, for example. The wire drawing (diameter reduction) is, for example, rotary swaging or cold drawing by a hole die. At this time, when the insulator is a compact, the compact becomes a powder by being crushed. Then, ends at one side of the element wires are taken out and welded to each other, thereby forming a temperature measurement junction, and an end portion of the metal tube at the temperature measurement junction side is covered. When the wire drawing is performed, there are problems that since the powder becomes compact and thus the element wires are constrained, the wires are easily broken during processing and that since expansion and contraction of the element wires to be caused by rising and lowering of a temperature is inhibited, the wires are easily broken, whereas according to the manufacturing method of the present disclosure, since the wire drawing is not performed, the wires are hardly broken.

EXAMPLE

The present disclosure will now be described in further detail with reference to examples, but the present disclosure is not construed as being limited to these examples.

Next, the embodiments of the present disclosure will be described in detail using examples indicating experimental results obtained by measuring a temperature using a thermocouple of the present disclosure. In a high temperature atmosphere of 1500° C. or higher, reaction of constituent members such as a protective tube, an insulator, and element wires or influence of impurities remarkably appears. As a result, alloying due to unexpected reaction and reduction in melting point occur, and electromotive force abnormality or deterioration in service life occurs in the thermocouple. For this reason, the temperature is measured using the thermocouple in a very severe atmosphere. In the case of a platinum thermocouple, when being used in a severe environment near an upper limit temperature (for example, 1500° C. or higher), but in an air atmosphere, since the service life thereof was shortened by approximately 50 hours, a guideline for determination of an available time was set to 50 hours.

Example 1

Figure 3:
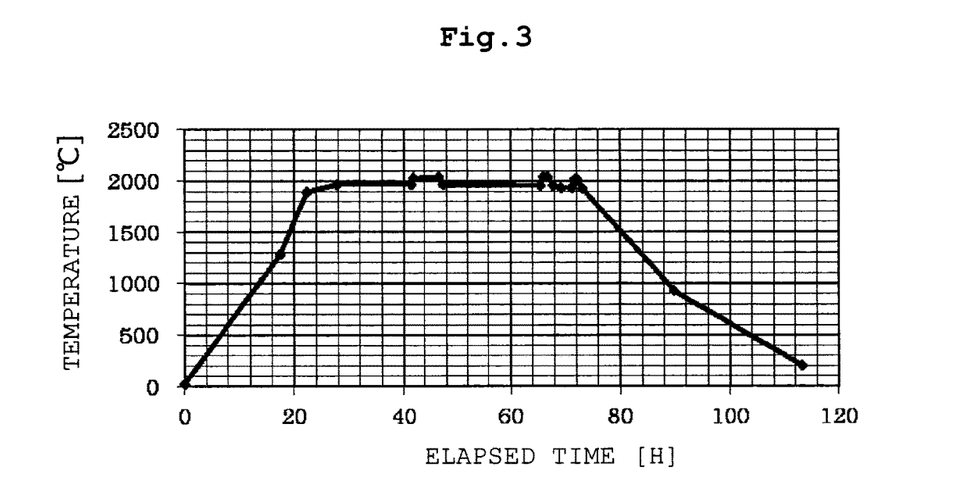
FIG. 3 is a diagram illustrating a relation between an elapsed time and a temperature according to Example 1.

A container contained with an aluminum oxide melt was installed in an electric furnace which was maintained at a nitrogen atmosphere; an Ir wire and an Ir-40 mass % Rh wire as element wires passed through holes of an insulating tube as insulator made of a metal oxide which was composed mainly of a hafnium oxide, end portions of the Ir wire and the Ir-40 mass % Rh wire were welded to each other, thereby forming a temperature measurement junction; a thermocouple having a structure in which the element wires and the insulating tube were inserted into a protective tube made of Ir (hereinafter, described as "Ir (protective tube)/metal oxide (insulating tube) composed mainly of the hafnium oxide/Ir and Ir-40 mass % Rh (element wires)") was vertically inserted into the electric furnace; and a temperature of the electric furnace was raised to 2000° C. and temperature measurement was performed on an area directly above the aluminum oxide melt. The protective tube had an outer diameter of 8 mm and a thickness of 1 mm, and the inside thereof was filled with Ar to be sealed. The insulating tube had an outer diameter of 3.2 mm, and was provided with two hole-tubes having an inner diameter of 0.9 mm to insert the element wires into the insulating tube. The material of the insulating tube contains a hafnium oxide as a main component and a zirconium oxide of 0.16 mass % in terms of the amount of zirconium and is configured such that the content of each element of Al, Fe, Si, and Ti is 100 ppm or less by mass and the content of C is 10 ppm or less by mass. Both of the element wires have a wire diameter of 0.5 mm. In addition, after the element wires and the insulating tube were inserted into the protective tube, wire drawing was not performed. A relation between an elapsed time and a temperature was illustrated in FIG. 3. The temperature measurement was performed under the above conditions, the temperature measurement was finished when 50 hours have passed after the temperature has reached 2000° C., but thermoelectromotive force abnormality has not occur in the thermocouple during the temperature measurement.

Example 2

A thermocouple having a structure of Mo (protective tube)/metal oxide (insulating tube) composed mainly of the hafnium oxide/Ir and Ir-40 mass % Rh (element wires) was horizontally inserted into an electric furnace which was maintained at a nitrogen atmosphere, a temperature of the electric furnace was raised to 2000° C., and temperature measurement was performed in the inside of the furnace. The protective tube had an outer diameter of 6.4 mm and a thickness of 0.9 mm, and the inside thereof was filled with Ar to be sealed. The insulating tube had an outer diameter of 3.2 mm, and was provided with two hole-tubes having an inner diameter of 0.9 mm to insert the element wires into the insulating tube. The material of the insulating tube contains a hafnium oxide as a main component and a zirconium oxide of 0.16 mass % in terms of the amount of zirconium and is configured such that the content of each element of Al, Fe, Si, and Ti is 100 ppm or less by mass and the content of C is 10 ppm or less by mass. Both of the element wires have a wire diameter of 0.5 mm. In addition, after the element wires and the insulating tube were inserted into the protective tube, wire drawing was not performed. The temperature measurement was performed under the above conditions, the temperature measurement was finished when 50 hours have passed after the temperature has reached 2000° C., but thermoelectromotive force abnormality has not occur in the thermocouple during the temperature measurement.

Example 3

A thermocouple having a structure of W (protective tube)/metal oxide (insulating tube) composed mainly of the hafnium oxide/Ir and Ir-40 mass % Rh (element wires) was vertically inserted into an electric furnace which was maintained at a vacuum state, a temperature of the electric furnace was raised to 1900° C., and temperature measurement was performed in the inside of the furnace. The protective tube had an outer diameter of 6.2 mm and a thickness of 0.8 mm, and the inside thereof was filled with Ar to be sealed. The insulating tube had an outer diameter of 3.2 mm, and was provided with two hole-tubes having an inner diameter of 0.9 mm to insert the element wires into the insulating tube. The material of the insulating tube contains a hafnium oxide as a main component and a zirconium oxide of 0.16 mass % in terms of the amount of zirconium and is configured such that the content of each element of Al, Fe, Si, and Ti is 100 ppm or less by mass and the content of C is 10 ppm or less by mass. Both of the element wires have a wire diameter of 0.5 mm. In addition, after the element wires and the insulating tube were inserted into the protective tube, wire drawing was not performed. The temperature measurement was performed under the above conditions, the temperature measurement was finished when 50 hours have passed after the temperature has reached 1900° C., but thermoelectromotive force abnormality has not occur in the thermocouple during the temperature measurement.

Example 4

A thermocouple having a structure of Ta (protective tube)/metal oxide (insulating tube) composed mainly of the hafnium oxide/Ir and Ir-40 mass % Rh (element wires) was vertically inserted into an electric furnace which was maintained at a vacuum state, a temperature of the electric furnace was raised to 1950° C., and temperature measurement was performed in the inside of the furnace. The protective tube had an outer diameter of 6 mm and a thickness of 1 mm, and the inside thereof was filled with Ar to be sealed. The insulating tube had an outer diameter of 3.2 mm, and was provided with two hole-tubes having an inner diameter of 0.9 mm to insert the element wires into the insulating tube. The material of the insulating tube contains a hafnium oxide as a main component and a zirconium oxide of 0.16 mass % in terms of the amount of zirconium and is configured such that the content of each element of Al, Fe, Si, and Ti is 100 ppm or less by mass and the content of C is 10 ppm or less by mass. Both of the element wires have a wire diameter of 0.5 mm. In addition, after the element wires and the insulating tube were inserted into the protective tube, wire drawing was not performed. The temperature measurement was performed under the above conditions, the temperature measurement was finished when 50 hours have passed after the temperature has reached 1950° C., but thermoelectromotive force abnormality has not occur in the thermocouple during the temperature measurement.

Example 5

A thermocouple having a structure of Ir (protective tube)/metal oxide (insulating tube) composed mainly of the hafnium oxide/W-5 mass % Re and W-26 mass % Re (element wires) was vertically inserted into an electric furnace which was maintained at an Ar atmosphere, a temperature of the electric furnace was raised to 1900° C., and temperature measurement was performed in the inside of the furnace. The protective tube had an outer diameter of 6 mm and a thickness of 1 mm, and the inside thereof was filled with Ar to be sealed. The insulating tube had an outer diameter of 3.2 mm, and was provided with two hole-tubes having an inner diameter of 0.9 mm to insert the element wires into the insulating tube. The material of the insulating tube contains a hafnium oxide as a main component and a zirconium oxide of 0.16 mass % in terms of the amount of zirconium and is configured such that the content of each element of Al, Fe, Si, and Ti is 100 ppm or less by mass and the content of C is 10 ppm or less by mass. Both of the element wires have a wire diameter of 0.5 mm. In addition, after the element wires and the insulating tube were inserted into the protective tube, wire drawing was not performed. The temperature measurement was performed under the above conditions, the temperature measurement was finished when 50 hours have passed after the temperature has reached 1900° C., but thermoelectromotive force abnormality has not occur in the thermocouple during the temperature measurement.

Example 6

A thermocouple having a structure of Mo (protective tube)/metal oxide (insulating tube) composed mainly of the hafnium oxide/W-5 mass % Re and W-26 mass % Re (element wires) was vertically inserted into an electric furnace which was maintained at an Ar atmosphere, a temperature of the electric furnace was raised to 1900° C., and temperature measurement was performed in the inside of the furnace. The protective tube had an outer diameter of 6.4 mm and a thickness of 0.9 mm, and the inside thereof was filled with Ar to be sealed. The insulating tube had an outer diameter of 3.2 mm, and was provided with two hole-tubes having an inner diameter of 0.9 mm to insert the element wires into the insulating tube. The material of the insulating tube contains a hafnium oxide as a main component and a zirconium oxide of 0.16 mass % in terms of the amount of zirconium and is configured such that the content of each element of Al, Fe, Si, and Ti is 100 ppm or less by mass and the content of C is 10 ppm or less by mass. Both of the element wires have a wire diameter of 0.5 mm. In addition, after the element wires and the insulating tube were inserted into the protective tube, wire drawing was not performed. The temperature measurement was performed under the above conditions, the temperature measurement was finished when 50 hours have passed after the temperature has reached 1900° C., but thermoelectromotive force abnormality has not occur in the thermocouple during the temperature measurement.

Example 7

A thermocouple having a structure of W (protective tube)/metal oxide (insulating tube) composed mainly of the hafnium oxide/W-5 mass % Re and W-26 mass % Re (element wires) was vertically inserted into an electric furnace which was maintained at an Ar atmosphere, a temperature of the electric furnace was raised to 1900° C., and temperature measurement was performed in the inside of the furnace. The protective tube had an outer diameter of 6.2 mm and a thickness of 0.8 mm, and the inside thereof was filled with Ar to be sealed. The insulating tube had an outer diameter of 3.2 mm, and was provided with two hole-tubes having an inner diameter of 0.9 mm to insert the element wires into the insulating tube. The material of the insulating tube contains a hafnium oxide as a main component and a zirconium oxide of 0.16 mass % in terms of the amount of zirconium and is configured such that the content of each element of Al, Fe, Si, and Ti is 100 ppm or less by mass and the content of C is 10 ppm or less by mass. Both of the element wires have a wire diameter of 0.5 mm. In addition, after the element wires and the insulating tube were inserted into the protective tube, wire drawing was not performed. The temperature measurement was performed under the above conditions, the temperature measurement was finished when 50 hours have passed after the temperature has reached 1900° C., but thermoelectromotive force abnormality has not occur in the thermocouple during the temperature measurement.

Example 8

A thermocouple having a structure of Ta (protective tube)/metal oxide (insulating tube) composed mainly of the hafnium oxide/W-5 mass % Re and W-26 mass % Re (element wires) was vertically inserted into an electric furnace which was maintained at an Ar atmosphere, a temperature of the electric furnace was raised to 1900° C., and temperature measurement was performed in the inside of the furnace. The protective tube had an outer diameter of 6 mm and a thickness of 1 mm, and the inside thereof was filled with Ar to be sealed. The insulating tube had an outer diameter of 3.2 mm, and was provided with two hole-tubes having an inner diameter of 0.9 mm to insert the element wires into the insulating tube. The material of the insulating tube contains a hafnium oxide as a main component and a zirconium oxide of 0.16 mass % in terms of the amount of zirconium and is configured such that the content of each element of Al, Fe, Si, and Ti is 100 ppm or less by mass and the content of C is 10 ppm or less by mass. Both of the element wires have a wire diameter of 0.5 mm. In addition, after the element wires and the insulating tube were inserted into the protective tube, wire drawing was not performed. The temperature measurement was performed under the above conditions, the temperature measurement was finished when 50 hours have passed after the temperature has reached 1900° C., but thermoelectromotive force abnormality has not occur in the thermocouple during the temperature measurement.

Example 9

An R-type thermocouple having a structure of Pt-10 mass % Rh (protective tube)/metal oxide (insulating tube) composed mainly of the hafnium oxide/Pt-13 mass % Rh and Pt (element wires) was vertically inserted into an electric furnace which was maintained at an air atmosphere, a temperature of the electric furnace was raised to 1500° C., and temperature measurement was performed in the inside of the furnace. The protective tube had an outer diameter of 6 mm, and the protective tube had a thickness of 1 mm. The insulating tube had an outer diameter of 3.2 mm, and was provided with two hole-tubes having an inner diameter of 0.9 mm to insert the element wires into the insulating tube. The material of the insulating tube contains a hafnium oxide as a main component and a zirconium oxide of 0.16 mass % in terms of the amount of zirconium and is configured such that the content of each element of Al, Fe, Si, and Ti is 100 ppm or less by mass and the content of C is 10 ppm or less by mass. Both of the element wires have a wire diameter of 0.5 mm. In addition, after the element wires and the insulating tube were inserted into the protective tube, wire drawing was not performed. The temperature measurement was performed under the above conditions, the temperature measurement was finished when 50 hours have passed after the temperature has reached 1500° C., but thermoelectromotive force abnormality has not occur in the thermocouple during the temperature measurement.

Example 10

An R-type thermocouple having a structure of Pt-10 mass % Rh (metal protective tube)/metal oxide (insulating tube) composed mainly of the hafnium oxide/Pt-13 mass % Rh and oxide dispersion strengthened platinum (element wires) was vertically inserted into an electric furnace which was maintained at an air atmosphere, a temperature of the electric furnace was raised to 1500° C., and temperature measurement was performed in the inside of the furnace. The protective tube had an outer diameter of 6 mm, and the protective tube had a thickness of 1 mm. The insulating tube had an outer diameter of 3.2 mm, and was provided with two hole-tubes having an inner diameter of 0.9 mm to insert the element wires into the insulating tube. The material of the insulating tube contains a hafnium oxide as a main component and a zirconium oxide of 0.16 mass % in terms of the amount of zirconium and is configured such that the content of each element of Al, Fe, Si, and Ti is 100 ppm or less by mass and the content of C is 10 ppm or less by mass. Both of the element wires have a wire diameter of 0.5 mm. In addition, after the element wires and the insulating tube were inserted into the protective tube, wire drawing was not performed. The temperature measurement was performed under the above conditions, the temperature measurement was finished when 50 hours have passed after the temperature has reached 1500° C., but thermoelectromotive force abnormality has not occur in the thermocouple during the temperature measurement.

Example 11

A B-type thermocouple having a structure of Pt-10 mass % Rh (protective tube)/metal oxide (insulating tube) composed mainly of the hafnium oxide/Pt-30 mass % Rh and Pt-6 mass % Rh (element wires) was vertically inserted into an electric furnace which was maintained at an air atmosphere, a temperature of the electric furnace was raised to 1700° C., and temperature measurement was performed in the inside of the furnace. The protective tube had an outer diameter of 6 mm, and the protective tube had a thickness of 1 mm. The insulating tube had an outer diameter of 3.2 mm, and was provided with two hole-tubes having an inner diameter of 0.9 mm to insert the element wires into the insulating tube. The material of the insulating tube contains a hafnium oxide as a main component and a zirconium oxide of 0.16 mass % in terms of the amount of zirconium and is configured such that the content of each element of Al, Fe, Si, and Ti is 100 ppm or less by mass and the content of C is 10 ppm or less by mass. Both of the element wires have a wire diameter of 0.5 mm. In addition, after the element wires and the insulating tube were inserted into the protective tube, wire drawing was not performed. The temperature measurement was performed under the above conditions, the temperature measurement was finished when 50 hours have passed after the temperature has reached 1700° C., but thermoelectromotive force abnormality has not occur in the thermocouple during the temperature measurement.

Example 12

A thermocouple having a structure of Ir (protective tube)/metal oxide (insulating tube) composed mainly of the hafnium oxide/Pt-20 mass % Rh and Pt-40 mass % Rh (element wires) was vertically inserted into an electric furnace which was maintained at an Ar atmosphere, a temperature of the electric furnace was raised to 1800° C., and temperature measurement was performed in the inside of the furnace. The protective tube had an outer diameter of 6 mm and a thickness of 1 mm, and the inside thereof was filled with Ar to be sealed. The insulating tube had an outer diameter of 3.2 mm, and was provided with two hole-tubes having an inner diameter of 0.9 mm to insert the element wires into the insulating tube. The material of the insulating tube contains a hafnium oxide as a main component and a zirconium oxide of 0.16 mass % in terms of the amount of zirconium and is configured such that the content of each element of Al, Fe, Si, and Ti is 100 ppm or less by mass and the content of C is 10 ppm or less by mass. Both of the element wires have a wire diameter of 0.5 mm. In addition, after the element wires and the insulating tube were inserted into the protective tube, wire drawing was not performed. The temperature measurement was performed under the above conditions, the temperature measurement was finished when 50 hours have passed after the temperature has reached 1800° C., but thermoelectromotive force abnormality has not occur in the thermocouple during the temperature measurement.

Example 13

A thermocouple having a structure in which an Ir wire and an Ir-40 mass % Rh wire were used as element wires, a temperature measurement junction was formed in such a manner that end portions of the Ir wire and the Ir-40 mass % Rh wire were welded to each other, the element wires were inserted into a protective tube made of Ir, and a metal oxide powder as an insulator which was composed mainly of a hafnium oxide was filled between the element wires and the protective tube (hereinafter, described as "Ir (protective tube)/metal oxide (insulator) composed mainly of the hafnium oxide/Ir and Ir-40 mass % Rh (element wires)") was vertically inserted into an electric furnace which was maintained at an Ar atmosphere, a temperature of the electric furnace was raised to 1900° C., and temperature measurement was performed in the inside of the furnace. The protective tube had an outer diameter of 6 mm and a thickness of 1 mm, and the inside thereof was filled with Ar to be sealed. The insulator used powders having an average particle size of 100 μm or less by a laser diffraction scattering method. The material of the insulator contains a hafnium oxide as a main component and a zirconium oxide of 0.30 mass % in terms of the amount of zirconium and is configured such that the content of each element of Al, Fe, Si, and Ti is 100 ppm or less by mass and the content of C is 10 ppm or less by mass. Both of the element wires have a wire diameter of 0.5 mm. In addition, after the element wires and the insulator were inserted into the protective tube, wire drawing was not performed. The temperature measurement was performed under the above conditions, the temperature measurement was finished when 50 hours have passed after the temperature has reached 1900° C., but thermoelectromotive force abnormality has not occur in the thermocouple during the temperature measurement.

Comparative Example 1

Figure 4:
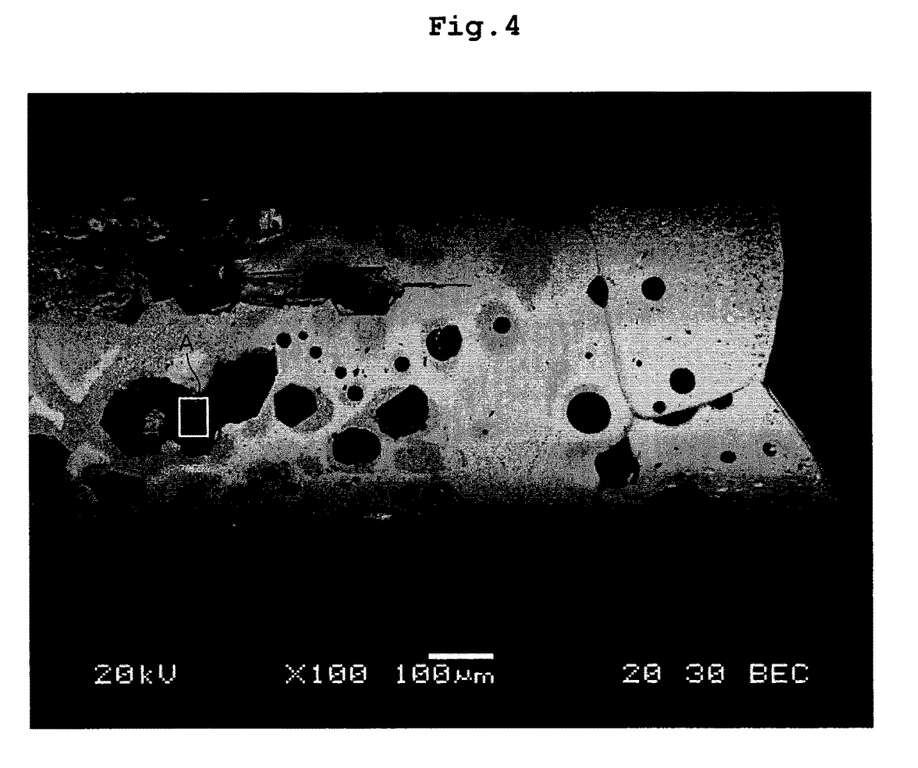
FIG. 4 is an SEM image of an area near a wire-broken portion according to Comparative Example 1.
Figure 5:
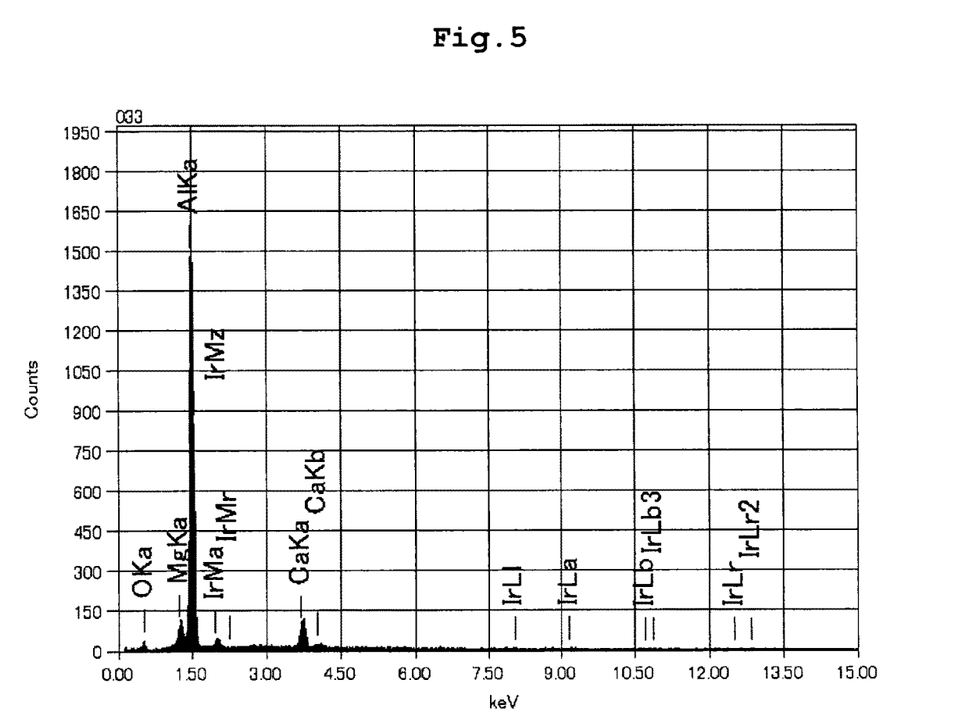
FIG. 5 is a diagram obtained by analyzing the area near the wire-broken portion according to Comparative Example 1 using an energy dispersive X-ray spectroscopic analysis (EDX).

A thermocouple having a structure of Ir (protective tube)/aluminum oxide (insulating tube)/Ir and Ir-40 mass % Rh (element wires) was vertically inserted into an electric furnace which was maintained at an Ar atmosphere, a temperature of the electric furnace was raised to 1900° C., and temperature measurement was performed in the inside of the furnace. The protective tube had an outer diameter of 6 mm and a thickness of 1 mm, and the inside thereof was filled with Ar to be sealed. The insulating tube had an outer diameter of 3.0 mm, and was provided with two hole-tubes having an inner diameter of 0.8 mm to insert the element wires into the insulating tube. Both of the element wires have a wire diameter of 0.5 mm. In addition, after the element wires and the insulating tube were inserted into the protective tube, wire drawing was not performed. As a result of which the temperature measurement was performed under the above conditions, since thermoelectromotive force abnormality has occurred when 9.1 hours have passed after the temperature has reached 1900° C., the temperature measurement is interrupted. As a result of which the inside of the thermocouple was confirmed by SEM, as illustrated in FIG. 4, it was confirmed that the Ir-40 mass % Rh (element wire) was broken. In addition, it was confirmed that the aluminum oxide (insulating tube) in the vicinity of the temperature measurement junction was deformed and changed in color. As a result of which a wire-broken portion ("A" portion in FIG. 4) was analyzed by an energy dispersive X-ray spectroscopic analysis (EDX), as illustrated in FIG. 5, impurities containing Al were detected.

Comparative Example 2

Figure 6:
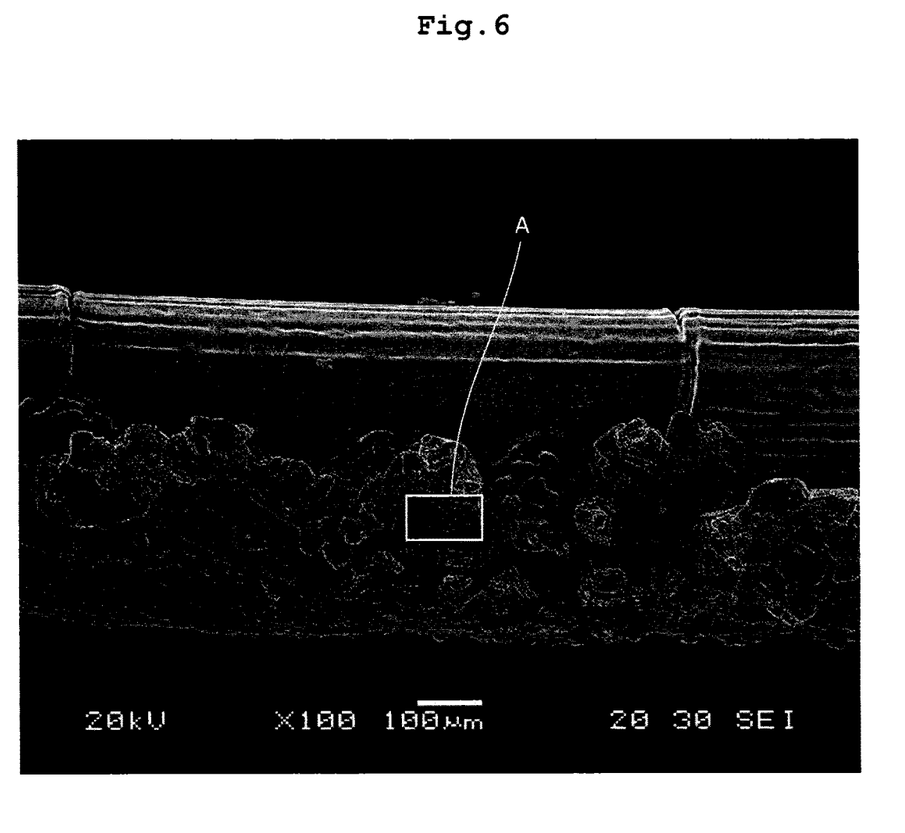
FIG. 6 is an SEM image of an area near a wire-broken portion according to Comparative Example 2.
Figure 7:
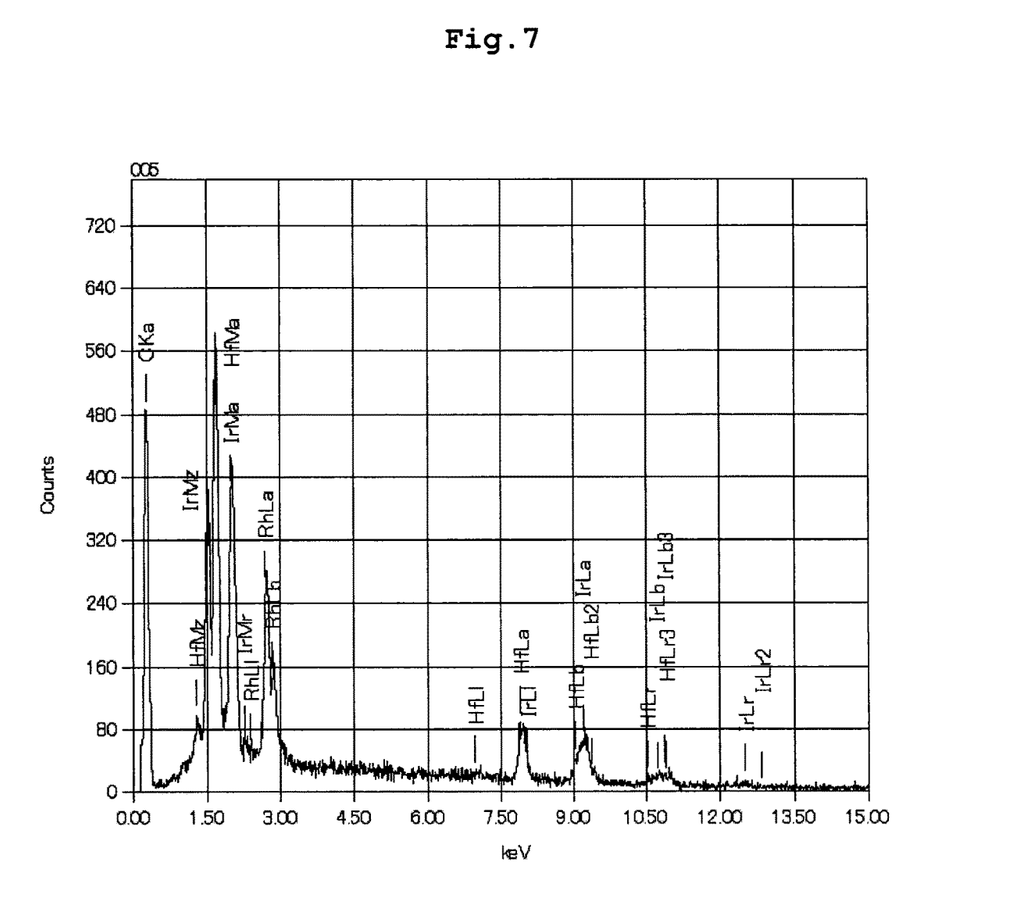
FIG. 7 is a diagram obtained by analyzing the area near the wire-broken portion according to Comparative Example 2 using an energy dispersive X-ray spectroscopic analysis (EDX).

A thermocouple having a structure of Ir (protective tube)/hafnium oxide (insulating tube)/Ir and Ir-40 mass % Rh (element wires) was vertically inserted into an electric furnace which was maintained at a vacuum state, a temperature of the electric furnace was raised to 1950° C., and temperature measurement was performed in the inside of the furnace. The protective tube had an outer diameter of 6 mm and a thickness of 1 mm, and the inside thereof was filled with Ar to be sealed. The insulating tube had an outer diameter of 3.0 mm, and was provided with two hole-tubes having an inner diameter of 0.8 mm to insert the element wires into the insulating tube. The material of the insulating tube contains a hafnium oxide as a main component and a zirconium oxide of 0.30 mass % in terms of the amount of zirconium and is configured such that the content of C is 33 ppm by mass. Both of the element wires have a wire diameter of 0.5 mm. In addition, after the element wires and the insulating tube were inserted into the protective tube, wire drawing was not performed. The temperature measurement was performed under the above conditions, the temperature measurement was finished when 50 hours have passed after the temperature has reached 1950° C., and the lowering of the temperature was performed. At this time, thermoelectromotive force abnormality has occurred in the thermocouple at the time of the lowering of the temperature. As a result of which the inside of the thermocouple was confirmed, it was confirmed that the Ir-40 mass % Rh (element wire) was broken. As a result of which an area in the vicinity of a wire-broken portion was observed by a scanning electron microscope (SEM), as illustrated in FIG. 6, evidence of the reaction in the surface of the element wires was confirmed. As a result of which this portion ("A" portion in FIG. 6) was analyzed by an energy dispersive X-ray spectroscopic analysis (EDX), as illustrated in FIG. 7, C and Hf were detected in addition to Ir and Rh.

Comparative Example 3

Figure 8:
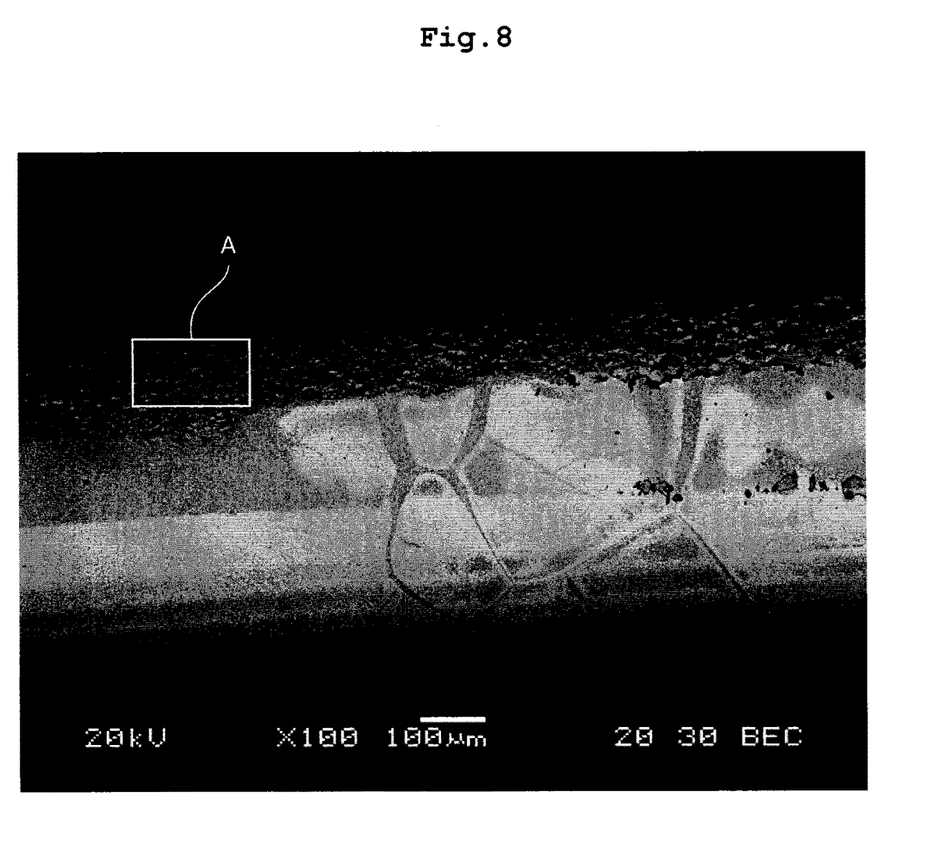
FIG. 8 is an SEM image of an area near a wire-broken portion according to Comparative Example 3.
Figure 9:
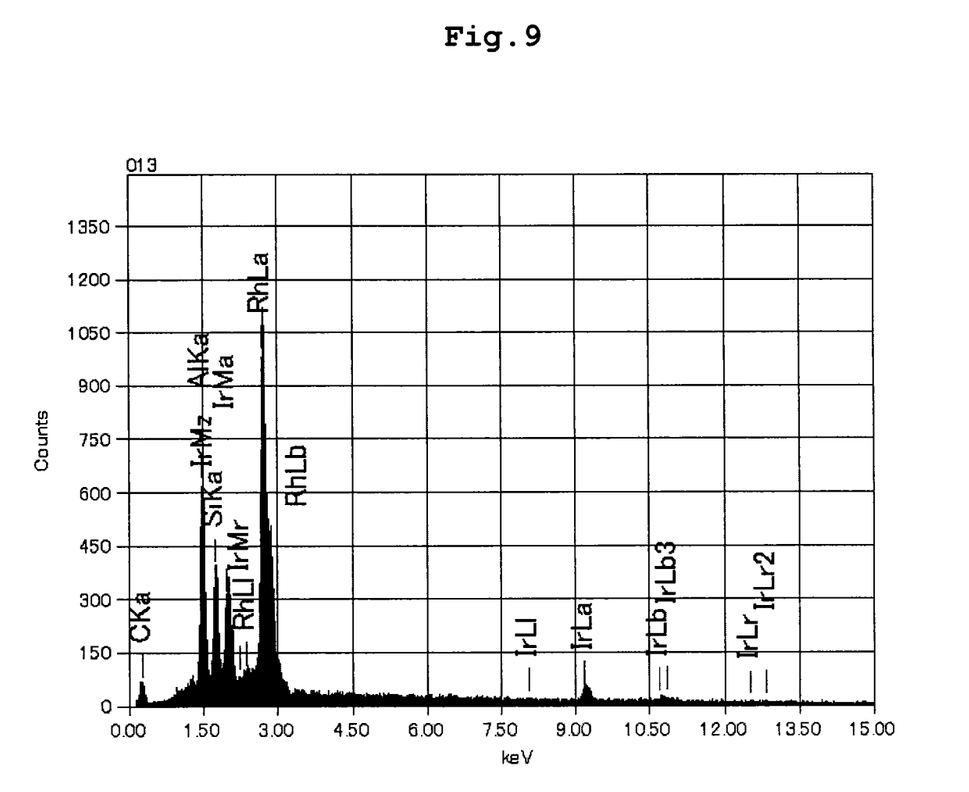
FIG. 9 is a diagram obtained by analyzing the area near the wire-broken portion according to Comparative Example 3 using an energy dispersive X-ray spectroscopic analysis (EDX).

A thermocouple having a structure of Ir (protective tube)/hafnium oxide (insulating tube)/Ir and Ir-40 mass % Rh (element wires) was vertically inserted into an electric furnace which was maintained at an Ar atmosphere, a temperature of the electric furnace was raised to 1900° C., and temperature measurement was performed in the inside of the furnace. The protective tube had an outer diameter of 6 mm and a thickness of 1 mm, and the inside thereof was filled with Ar to be sealed. The insulating tube had an outer diameter of 3.0 mm, and was provided with two hole-tubes having an inner diameter of 0.8 mm to insert the element wires into the insulating tube. The material of the insulating tube contains a hafnium oxide as a main component, Al of 1800 ppm by mass, and Si of 300 ppm. Both of the element wires have a wire diameter of 0.5 mm. In addition, after the element wires and the insulating tube were inserted into the protective tube, wire drawing was not performed. The temperature measurement was performed under the above conditions, the temperature measurement was interrupted when 50 hours have passed after the temperature has reached 1900° C., and the lowering of the temperature was performed. At this time, thermoelectromotive force abnormality has occurred in the thermocouple at the time of the lowering of the temperature. As a result of which the inside of the thermocouple was confirmed, it was confirmed that the Ir-40 mass % Rh (element wire) was broken. As a result of which an area in the vicinity of a wire-broken portion was observed by a scanning electron microscope (SEM), as illustrated in FIG. 8, evidence of the reaction in the surface of the element wires was confirmed. As a result of which the area in the vicinity of the wire-broken portion ("A" portion in FIG. 8) was analyzed by an energy dispersive X-ray spectroscopic analysis (EDX), as illustrated in FIG. 9, Al and Si were detected in addition to Ir and Rh.

Comparative Example 4

After a thermocouple having a structure of Mo (protective tube)/hafnium oxide (insulator)/Ir and Ir-40 mass % Rh (element wires) was formed, the thermocouple was fabricated by wire drawing. The protective tube had an outer diameter of 4.8 mm, and the protective tube had a thickness of 0.5 mm. An insulator used powders having a particle size of 0.1 mm or smaller. Both of the element wires have a wire diameter of 0.5 mm. In addition, after the element wires and the insulating tube were inserted into the protective tube, the wire drawing was performed under various conditions, but most of the wires were broken during the processing. Breaking of wires was determined by checking conduction between the element wires, and it was determined that the wires were broken when the conduction failed. Although the inventors tried to check the conduction between the element wires and to measure a temperature inside a furnace by vertically inserting a thermocouple, on which the conduction check has been performed, into an electric furnace which was maintained at an Ar atmosphere, thermoelectromotive force abnormality occurred at the time of rising the temperature, and thus the temperature rise and the measurement were interrupted. As a result of which the conduction check was performed between the element wires, since the conduction failed, it was determined that the wires were broken.

REFERENCE SIGNS LIST 1, 10 THERMOCOUPLE
12 Ir WIRE
13 Ir·Rh WIRE
14 TEMPERATURE MEASUREMENT JUNCTION
5, 15 INSULATOR
5a, 5b ELONGATED HOLE
16 PROTECTIVE TUBE
16a SEALING PORTION
17a, 17b OXYGEN BARRIER FILM

What is claimed is:
1. A thermocouple comprising:
an insulator;
a protective tube comprising: (1) at least one pure metal selected from the group consisting of: Ir, Rh, Ru, Mo, Re, Nb, Ta, and W; (2) at least one alloy selected from the group consisting of: Pt—Rh, Pt—Ir, Ir—Rh, Ir—Ru, Ir—Re, Ir—W, Mo—Re, Mo—Nb, Mo—Ta, Mo—W, Nb—Ta, Nb—W, and Ta—W; (3) an oxide dispersion strengthened alloy obtained by dispersing an oxide into a pure metal selected from the group consisting of: Ir, Pt, Rh, Ru, Mo, Re, Nb, Ta, and W; or (4) an oxide dispersion strengthened alloy obtained by dispersing an oxide into an alloy selected from the group consisting of: Pt—Rh, Pt—Ir, Ir—Rh, Ir—Ru, Ir—Re, Ir—W, Mo—Re, Mo—Nb, Mo—Ta, Mo—W, Nb—Ta, Nb—W, and Ta—W; and
element wires,
wherein the protective tube and the element wires are insulated from one another by the insulator, and
wherein the insulator is either one or both of a powder and a compact,
wherein the insulator is composed of at least one oxide selected from the group consisting of: a zirconium oxide, a hafnium oxide, and a composite oxide of zirconium and hafnium, and wherein the insulator comprises 0 to 100 ppm by mass of each of Al, Fe, Si, and Ti and 0 to 10 ppm by mass of C.

2. The thermocouple according to claim 1, wherein the element wires have a surface covered with an oxygen barrier film, and the oxygen barrier film has a thickness that is 20 nm or more but 800 nm or less.

3. The thermocouple according to claim 2, wherein the oxygen barrier film to cover the surface of the element wires contains an oxide as a main component, and an element for bonding with oxygen in the oxide is either one or both of Hf and Zr.

4. The thermocouple according to claim 3, wherein the oxygen barrier film for covering the surface of the element wires comprises the same material as the insulator.

5. The thermocouple according to claim 1, wherein the element wires are formed using one or two elements selected from Ir, Pt, Rh, Mo, Re, Nb, Ta, and W.

6. The thermocouple according to claim 1, wherein at least one of all or part of an outer surface of the protective tube and all or part of an inner surface of the protective tube is covered with an oxygen barrier film, and the oxygen barrier film has a thickness of 20 nm or more but 800 nm or less.

7. The thermocouple according to claim 6, wherein the oxygen barrier film to cover an outer surface or an inner surface of the protective tube contains an oxide as a main component, and an element for bonding with oxygen in the oxide is either one or both of Hf or Zr.

8. The thermocouple according to claim 7, wherein the oxygen barrier film for covering the surface of the protective tube comprises the same material as the insulator.

9. The thermocouple according to claim 1, wherein the protective tube is formed using one or two elements selected from Ir, Pt, Rh, Ru, Mo, Re, Nb, Ta, or W.

10. The thermocouple according to claim 1,
wherein the insulator comprises the compact and is composed of the zirconium oxide or the hafnium oxide,
wherein the zirconium oxide is at least one zirconia selected from the group consisting of: yttria-stabilized-zirconia, calcia-stabilized-zirconia, and magnesia-stabilized-zirconia, and
wherein the hafnium oxide is at least one hafnia selected from the group consisting of: yttria-stabilized hafnia, calcia-stabilized-hafnia, and magnesia-stabilized-hafnia.

11. The thermocouple according to claim 1, wherein the insulator comprises the compact and is composed of the zirconium oxide not containing a stabilizing agent or the hafnium oxide not containing a stabilizing agent; and wherein the compact as the insulator has a relative bulk density of is 95% or less.

* * * * *